Dec. 12, 1967 R. E. JONES, JR 3,357,871

METHOD FOR FABRICATING INTEGRATED CIRCUITS

Filed Jan. 12, 1966

*INVENTOR.*
ROBERT E. JONES JR.
*BY* P.E. Henninger
ATTORNEY

United States Patent Office 3,357,871

Patented Dec. 12, 1967

3,357,871
METHOD FOR FABRICATING INTEGRATED CIRCUITS

Robert E. Jones, Jr., Poughkeepsie, N.Y., assignor to International Business Machines Corporation, Armonk, N.Y., a corporation of New York Filed Jan. 12, 1966, Ser. No. 520,245
12 Claims. (Cl. 148—175)

ABSTRACT OF THE DISCLOSURE

The process of forming isolated islands of semiconductor material surrounded by an insulating barrier so that a precise thickness of the isolated islands can be readily obtained. Contact of the grown material with the substrate through holes in the insulating barrier provides a current path for the removal of substrate material by means of electropolishing. By this arrangement, removal of material from the isolated islands is automatically stopped because the current path is interrupted upon reaching the lower limit of the surrounding insulating barrier.

This invention relates to semiconductor circuitry, and more particularly, to a technique of forming integrated or solid state semiconductor circuits.

From the very beginning of the revival of interest in semiconductors which followed the development of the transistor, much effort has been directed to the attainment of miniaturized or microelectronic circuitry incorporating solid state devices in complex arrangements. Although semiconductor devices themselves had been scaled down to miniscule sizes on the order of several mils, that is, thousandths of an inch in dimensions, complete circuit configurations have not kept pace in scaling down to the ultimate in miniaturization. Printed circuit and other techniques have been employed in the past in the attempt to achieve reasonably high packing densities in the formation of circutis utilizing semiconductor devices. Only very recently, however, have the so-called integrated approaches to device fabrication and to the connecting of such devices in various circuit configurations become practicable.

Various approaches to device and circuit fabrication have been lumped under the heading of "integrated" circuit techniques. According to one of these approaches the devices themselves are produced quite conventionally by sequential diffusion steps involving the diffusion of several desired impurity materials into a semiconductor wafer, followed by the dicing or cutting up of the semiconductor wafer, into single or multiple device "chips." These "chips" are then secured to a circuit board or module and are connected in complex arrays by known printed circuit techniques. The passive components, such as resistors, required for the circuit configuration are, for example, simply provided by deposition of suitable resistance material on the module. Similarly, other desired passive components are formed on the module.

The most advanced form of integrated circuitry that has been proposed is the so-called monolithic form. Such an approach envisions the embodying of great numbers of devices, be they passive or active, in a block or monolith of semiconductor material. Generally all of the active and passive components are left in place within the monolith following the controlled diffusion steps and by predetermined judicious selection and interconnection of simple circuit configurations for performing given functions, such as AND/OR logic, vast complex circuit arrangements such as are involved in a computer may be realized within a small volume.

Although the foregoing circuit complexes may be produced as indicated, for the ultimate in high-speed operation of such circuits with reliability and reproducibility, it becomes highly desirable that the individual circuit elements be completely electrically isolated from each other since, as noted, all of the devices are contained within a common block or monolith of semiconductor material and hence, comprise a single physical unit.

Accordingly, it is a primary object of the present invention to realize completely the aforesaid advantages of monolithic integrated circuitry by an improvement in the technique of providing the needed isolation between the individual components in such integrated circuitry.

Previous proposals for taking advantage of monolithic integrated designs have attempted to solve the problem of electrically isolating individual components by means such as diffusion of an isolation region within the monolith or by interposing an insulating material in an etched out groove extending through the entire monolith of semiconductor material. It has also been proposed that the required isolation be achieved by etching channels in the top surface of a semiconductor wafer, and by thereafter forming an oxide layer in these etched channels to produce an insulative configuration which results in isolated islands of monocrystalline material in which the required devices my subsequently be formed.

It is therefore another object of the present invention to improve upon the last named technique of creating isolated islands suitably insulated from each other by an oxide layer by precisely determining the thickness of the isolated islands.

In accordance with the technique of the present invention the required isolation for the multiplicity of transistor and diode elements to be incorporated into the desired circuitry is achieved in the following way.

Isolation channels are first formed, as by etching, in the top surface of a monocrystalline semiconductor wafer. Then, an oxide layer is formed over the top surface and down into the etched channels. This is followed by the growth of a polycrystalline layer over the oxide layer. Thereafter the bulk of the original monocrystalline wafer is removed down to the lower limit of the oxide formation in the etched channels. This removal is uniquely accomplished by means of electropolishing, such that the thickness of the material in the isolated regions or islands is precisely determined by the oxide isolated barrier which automatically stops the electropolishing at a point determined by the depth of the etched channels. Within these isolated islands of monocrystalline material the required transistors and diodes may subsequently be formed.

The foregoing and other objects, features and advantages of the invention will be apparent from the following more particular description of preferred embodiments of the invention, as illustrated in the accompanying drawings.

Figure 1:
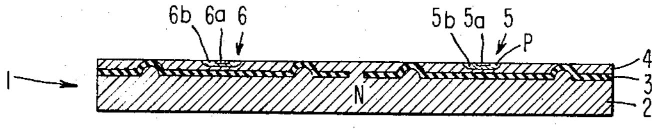
FIG. 1 is a sectional view of a completed semiconductor unit in accordance with the technique of the present invention.

Referring now to FIG. 1, there is shown a structure generally designated 1, consisting of a support or base member 2, an insulating layer 3, and a monocrystalline layer 4. Within the layer 4 there are embedded two typical transistor elements 5 and 6, having, respectively, an emitter region 5_a_ and base region 5_b_, and an emitter region 6_a_ and base region 6_b_. The configuration of the insulating layer 3 provides that the separate transistor elements 5 and 6 are electrically isolated from each other.

The process which is productive of the semiconductor unit of FIG. 1 is illustrated in FIGS. 2 to 6.

Figure 2:
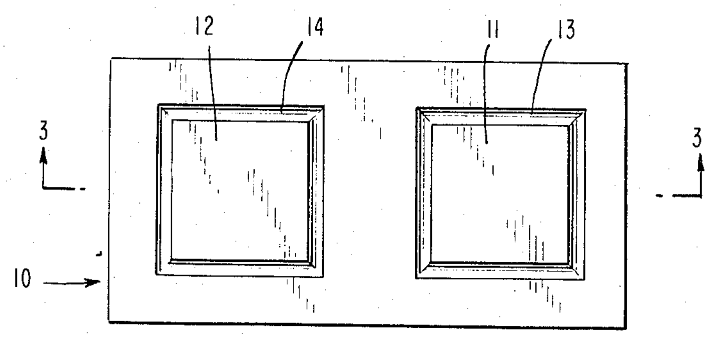
FIG. 2 is a plan view of a semiconductor wafer.

In FIG. 2, a wafer 10 of monocrystalline semiconductor material is shown which has been prepared by established procedures. Although a complicated variety of device configurations may be formed within such a wafer, for ease in understanding the present invention only two isolated regions, 11 and 12, are illustrated. Surrounding the regions 11 and 12 are etched isolation channels or moats 13 and 14, respectively. The channels 13 and 14 have been realized by first oxidizing the wafer 10 completely, followed by removal of the oxide in the desired pattern of isolation. Thus, the entire top surface 15 of the wafer 10 which is, for example, selected to be of silicon, is coated with an oxide, for example, by genetically forming a silicon oxide layer in the form of $SiO_2$ on the wafer 10. The desired isolation pattern is accomplished by using a photoresist coating over the oxide coating to mask all the oxide area except the pattern desired. This step is followed by the application of HF solution to remove the oxide in the unmasked regions. Such photoresist techniques are well understood by those versed in the art.

The oxide having been removed in the channel pattern previously formed, the body of the silicon is etched in this pattern by using an appropriate $HNO_3$—HF—$H_2O$ solution to create the isolation channels 13 and 14.

Figure 3:
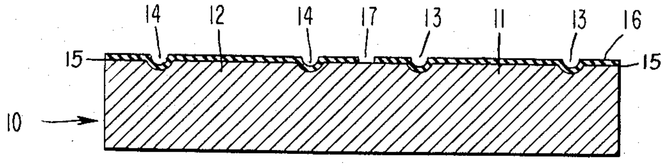
FIGS. 3 to 6 are sectional views of the same wafer shown at various stages in the processing according to the present invention.

Following the foregoing operation, the original oxide layer is completely stripped from the surface 15, and as illustrated in the sectional view of FIG. 3, a new oxide layer 16 is formed thereover and down into the etched channels.

A series of holes which are displaced from the isolation regions 11 and 12, are then etched in the oxide coating 16. One of these holes designated 17, is shown in FIG. 3. This is accomplished again by using the usual photoresist and etching techniques described previously.

Figure 4:
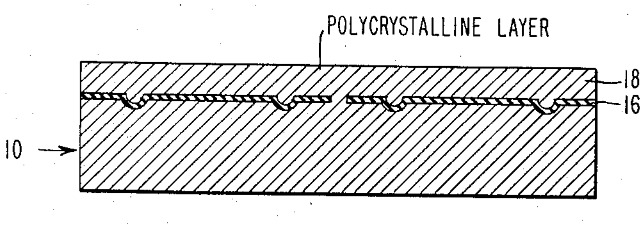

As illustrated in FIG. 4, a thick polycrystalline semiconductor layer 18 is then grown over the oxide layer. This grown layer 18 will form the substrate for the completed devices. Considering the structure in FIG. 4, it will be appreciated that the effect of the holes in the silicon oxide layer is to allow good electrical contact between the original wafer 10 and the deposited polycrystalline layer 18.

Figure 5:
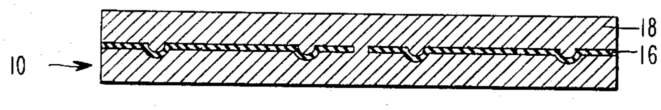
Figure 6:
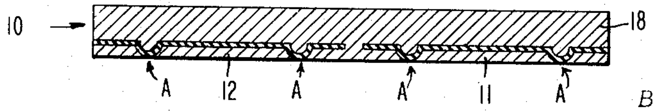

The structure of FIG. 4, is then mounted for the electropolishing operation with the deposited layer 18 in electrical contact with the positive pole of the current supply (not shown). The negative pole of the current supply is, of course, in contact with the original monocrystalline wafer 10 so that the complete circuit path is established only by reason of the contact of layer 18 with the wafer 10 at the exemplary opening 17, since the oxide layer 16 serves to electrically isolate at all other points. The electropolishing is allowed to proceed and an intermediate of this procedure is depicted in FIG. 5. Finally, the structure of FIG. 6 is obtained. The removal of the material of the original wafer 10 is automatically stopped when the material has been completely removed at the points A. At this juncture the material inside the isolation regions 11 and 12 is no longer in electrical contact with the other material, and consequently can not be removed, since current flow is essential to remove surface material during electropolishing.

When the structure of FIG. 6 has been obtained the unit is now suitable for making isolated transistors or diodes. Typically, this is accomplished by the controlled diffusion of a selected impurity into the top surface of the wafer. Thus, the wafer 10 depicted in FIG. 6 is inverted and corresponds to wafer 1 in FIG. 1. There is formed first a base layer such as *6b*, shown embedded within the unit of FIG. 1. The subsequent limited diffusion of an impurity of opposite polarity into the base layer *6b* forms an emitter layer *6a*, also is depicted in FIG. 1. The oxide mask used for the emitter diffusion is, in accordance with well-known techniques, left on the top surface of the wafer and conductive steps are formed thereover for appropriate connections between devices, as, for example, devices 5 and 6 illustrated.

The fabrication method of the present invention has several advantages over previously proposed schemes. Thus, as will be appreciated from the foregoing description, the original wafer is largely removed by the electrolytic polishing procedure which does not introduce surface damage or defects. Also, the thickness of the material in the isolated regions is precisely determined by a silicon oxide barrier which stops the electropolishing inside the isolated regions at a point determined by the depth of the etched channels. Thus, the alignment of the wafer during the electropolishing step need not be as precise as would be required with mechanical polishing.

While there have been shown and described and pointed out the fundamental novel features of the invention as applied to the preferred embodiments, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A process of fabricating semiconductor devices comprising the steps of forming isolation channels in the upper surface of a monocrystalline semiconductor wafer, forming an oxide layer over said surface and into said channels, forming openings in said oxide layer to said surface, growing a layer of semiconductor material over said oxide layer and into said previously formed openings to contact said surface, removing the monocrystalline material of said original wafer by electropolishing, the contact between said grown layer and said wafer at said openings providing a current path therefor, said removal step being continued until said oxide layer is reached, whereby said removal is automatically stopped, and forming devices in the isolated islands of monocrystalline material.

2. A process as defined in claim 1, wherein said wafer is constituted of silicon and said oxide layer is $SiO_2$.

3. A process as defined in claim 1, wherein said grown layer is constituted of polycrystalline silicon.

4. A process as defined in claim 1, wherein said isolation pattern is etched into said wafer using $$HNO_3—HF—H_2O$$

5. A process of fabricating semiconductor devices comprising the steps of forming a plurality of moats completely surrounding discrete portions of semiconductor material on the surface of a monocrystalline wafer, forming an oxide layer over said surface and into said moats, forming openings in said oxide layer between adjacent moats, growing a layer of semiconductor material at said surface over said oxide layer and into said openings thereby to contact the surface of said wafer, removing the monocrystalline material of said original wafer by electropolishing, the contact between said grown layer and said wafer at said openings providing a current path therefor, said removal step being continued until said oxide layer is reached, whereby said removal is automatically stopped and, forming devices in the isolated islands of monocrystalline material.

6. A process as defined in claim 5, wherein said wafer is constituted of silicon and said oxide layer is $SiO_2$.

7. A process as defined in claim 5, wherein said grown layer is constituted of polycrystalline silicon.

8. A process as defined in claim 5, wherein said isolation pattern is etched into said wafer using $$HNO_3—HF—H_2O$$

9. A process of fabricating semiconductor devices comprising the steps of forming isolation channels in a surface of a semiconductor substrate, forming an insulating layer over said surface and into said channels forming openings in said insulating layer to said surface, growing a layer of semiconductor material over said insulating layer and into said previously-formed openings to contact said surface, removing material from said substrate by electropolishing, the contact between said grown layer and said substrate at said openings providing a current path for the electropolishing operation, said removal step being continued until said insulating layer is reached, whereby removal of the material from the regions defined by the isolation channels is automatically stopped.

10. A process as defined in claim 9, further including the step of forming devices in the thus-defined isolated regions.

11. A process as defined in claim 10, wherein said substrate is constituted of silicon and said insulating layer is $SiO_2$.

12. A process as defined in claim 10, wherein said openings are placed between adjacent isolation channels.

References Cited

Electronic Design, Apr. 13, 1964, pp. 12–14.
Electronic News, Apr. 20, 1964, p. 42.
Electronics Review, vol. 37, No. 17, June 1, 1964, p. 23.

DAVID L. RECK, *Primary Examiner.*

N. F. MARKVA, *Assistant Examiner.*

Disclaimer 3,357,871.—*Robert E. Jones, Jr.*, Poughkeepsie, N.Y. METHOD FOR FABRICATING INTEGRATED CIRCUITS. Patent dated Dec. 12, 1967. Disclaimer filed June 25, 1971, by the assignee, *International Business Machines Corporation.*

Hereby enters this disclaimer to claims 1–4 and 9–12, inclusive, of said patent.

[*Official Gazette April 29, 1975.*]